(12) United States Patent
Wagenleitner

(10) Patent No.: US 9,613,840 B2
(45) Date of Patent: Apr. 4, 2017

(54) APPARATUS AND METHOD FOR BONDING SUBSTRATES

(75) Inventor: Thomas Wagenleitner, Aurolzmünster (AT)

(73) Assignee: EV Group E. Thallner GmbH (AT)

( * ) Notice: Subject to any disclaimer, the term of this patent is extended or adjusted under 35 U.S.C. 154(b) by 542 days.

(21) Appl. No.: 14/238,091

(22) PCT Filed: Aug. 22, 2011

(86) PCT No.: PCT/EP2011/064353
§ 371 (c)(1),
(2), (4) Date: Feb. 10, 2014

(87) PCT Pub. No.: WO2013/023708
PCT Pub. Date: Feb. 21, 2013

(65) Prior Publication Data
US 2014/0209230 A1      Jul. 31, 2014

(30) Foreign Application Priority Data

Aug. 12, 2011   (EP) .................. PCT/EP2011/063968

(51) Int. Cl.
*H01L 21/673*   (2006.01)
*H01L 21/683*   (2006.01)
*H01L 21/67*    (2006.01)

(52) U.S. Cl.
CPC ...... *H01L 21/673* (2013.01); *H01L 21/67092* (2013.01); *H01L 21/6838* (2013.01); *Y10T 156/10* (2015.01)

(58) Field of Classification Search
None
See application file for complete search history.

(56) References Cited

U.S. PATENT DOCUMENTS

| 5,564,682 A | 10/1996 | Tsuji ................. B25B 11/00 |
| 6,556,281 B1 | 4/2003 | Govil et al. ................. 355/72 |
| 2002/0001920 A1 | 1/2002 | Takisawa et al. ............. 438/455 |

(Continued)

FOREIGN PATENT DOCUMENTS

| CN | 102092558 A | 6/2011 | ............ B65G 15/30 |
| EP | 0926706 | 6/1999 | ............ H01L 21/00 |

(Continued)

OTHER PUBLICATIONS

Office Action received in corresponding Chinese Patent Application No. 201180072828.2, dated Oct. 19, 2015.

(Continued)

*Primary Examiner* — Barbara J Musser
(74) *Attorney, Agent, or Firm* — Kusner & Jaffe

(57) ABSTRACT

This invention relates to a method and a device for temporary bonding of a first substrate with a second substrate. The device is comprised of a mounting apparatus for mounting of the first substrate on a mounting contour with an active mounting surface. The mounting apparatus has an outer ring section for controllable fixing of the first substrate. Deformation means are provided for controllable deformation of the first substrate. The deformation means act within the outer ring section. Bonding means are provided for bonding of the first substrate with the second substrate.

14 Claims, 7 Drawing Sheets

(56) References Cited

U.S. PATENT DOCUMENTS

| | | | | |
|---|---|---|---|---|
| 2004/0036850 A1* | 2/2004 | Tsukamoto | ............ | G03F 7/707 |
| | | | | 355/72 |
| 2007/0275544 A1* | 11/2007 | Maki | ................ | H01L 21/67092 |
| | | | | 438/464 |
| 2010/0248446 A1* | 9/2010 | Liu | ....................... | H01L 21/304 |
| | | | | 438/459 |
| 2013/0147129 A1* | 6/2013 | Chiu | .................. | H01L 21/6831 |
| | | | | 279/3 |
| 2014/0072774 A1* | 3/2014 | Kito | ................. | H01L 21/67092 |
| | | | | 428/174 |

FOREIGN PATENT DOCUMENTS

| | | | | |
|---|---|---|---|---|
| JP | H05-90393 A | 4/1993 | ............ | H01L 21/02 |
| JP | 5090393 | 9/1993 | ............ | H01L 21/68 |
| JP | H11-195567 A | 7/1999 | ............ | H01L 21/02 |
| WO | WO 01/90820 | 11/2001 | ................ | G03F 7/20 |
| WO | WO 2004/011953 | 2/2004 | ............ | G01R 31/26 |

OTHER PUBLICATIONS

Office Action received in corresponding Japanese Patent Application No. 2014-525328, dated Aug. 31, 2015 (English machine translation provided).

International Search Report for Int'l Application No. PCT/EP2011/064353, dated Dec. 1, 2011—3 pages.

\* cited by examiner

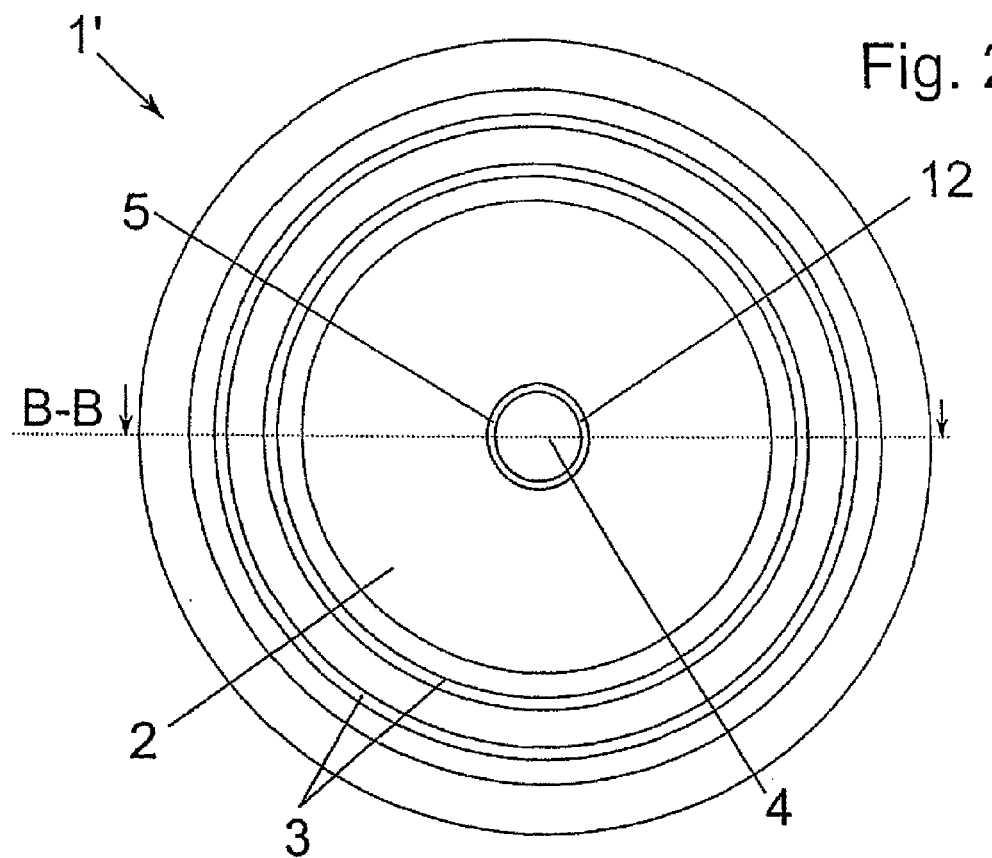
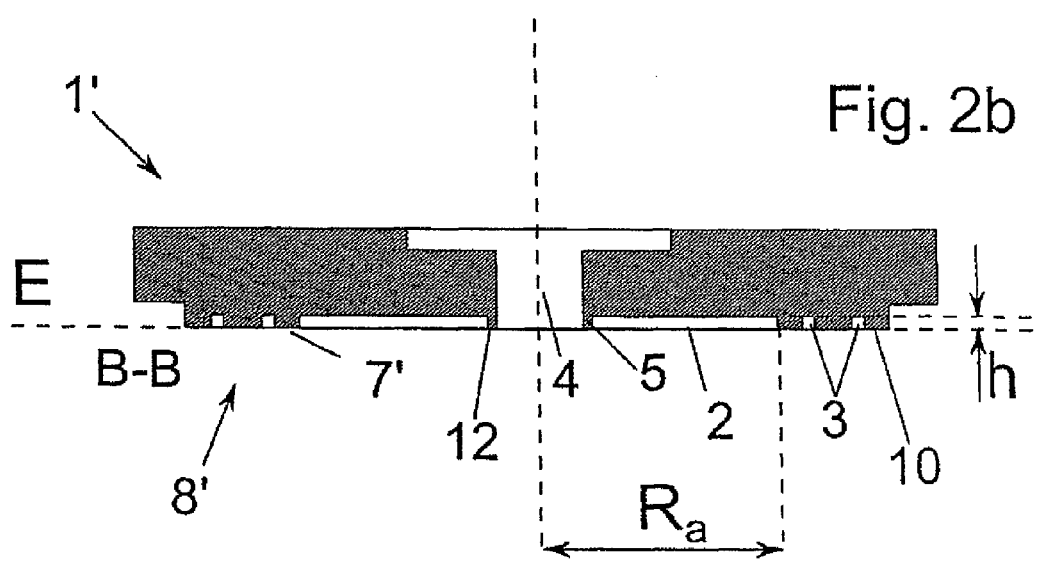

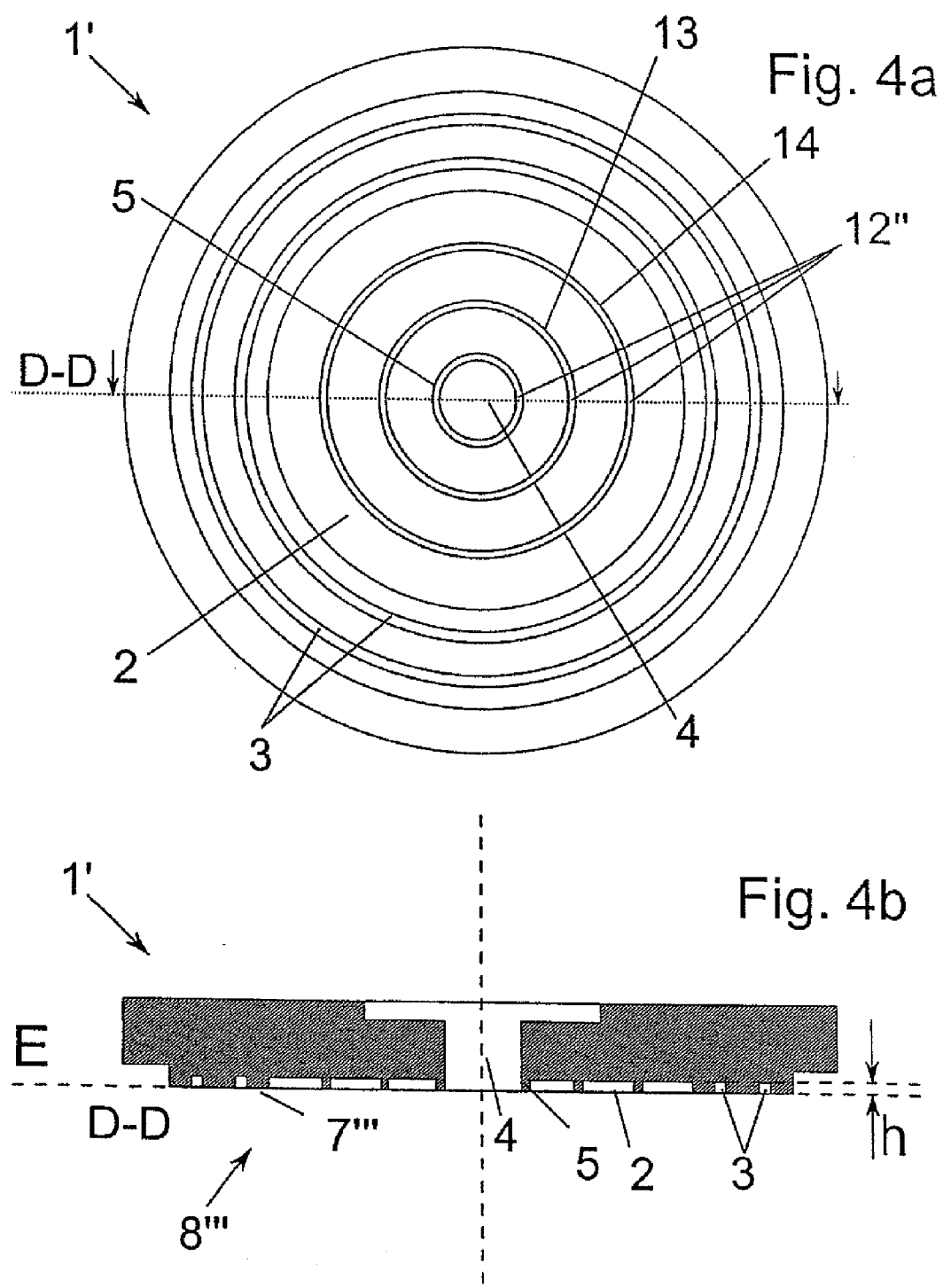

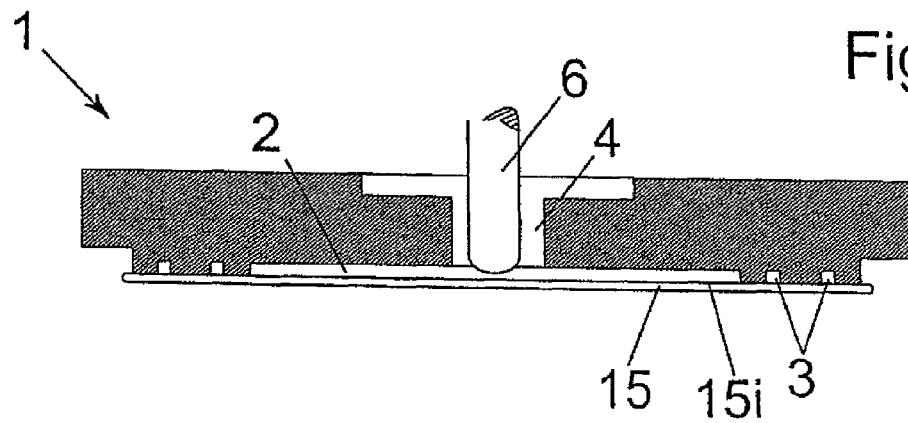
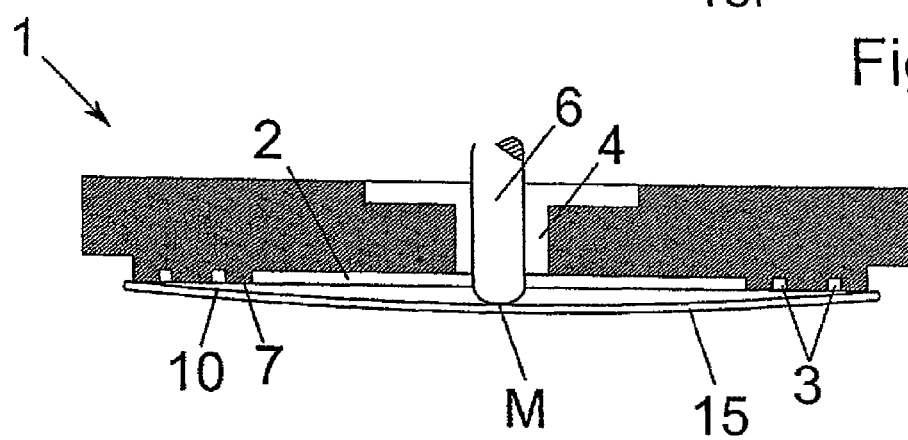
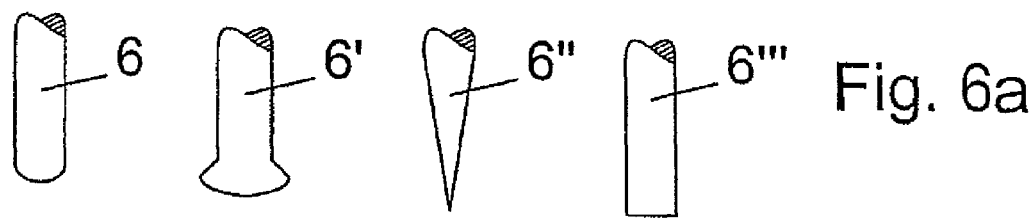

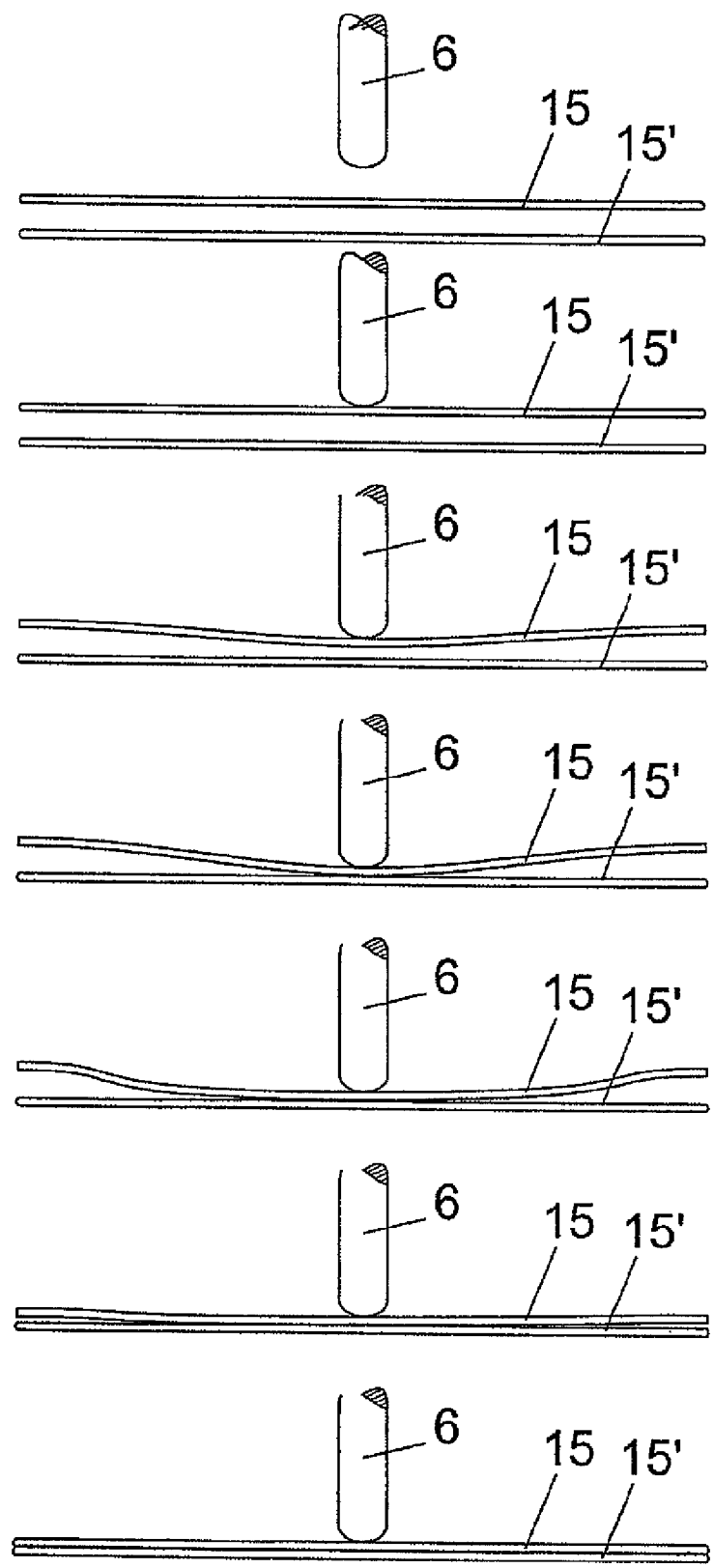

APPARATUS AND METHOD FOR BONDING SUBSTRATES

FIELD OF INVENTION

This invention relates to a device for temporary bonding, especially prebonding, of a first substrate to a second substrate.

BACKGROUND INFORMATION

In the semiconductor industry mounting apparatus or sample holders (so called chucks) are used as handling apparatus for supporting and fixing flat semiconductor substrates, especially wafers. The wafers lie flat, when supported by the mounting apparatus, and are fixed and can be transported to various handling steps and processing stations.

Typically, it is necessary to transfer the wafer from one mounting apparatus to another. Not only is reliable and flat support/fixing necessary, but detachment of the wafer as simply and carefully as possible, also plays a major part.

The fixing takes place for example by applying a vacuum between the wafer and the mounting apparatus, by electrostatic charging or by other controllable chemical-physical adhesion properties. The detachment of the wafer becomes technically more and more difficult due to the increasingly thinner wafer, which is sometimes even polished on both sides, and the optionally existing inherent adhesion of the wafer to the sample holder. The surfaces on which fixing takes place can also be provided with a pattern, grooving or any other topography which further reduces the contact surface in order to obtain a mounting surface as small as possible.

Avoiding contamination is also an important aspect.

The latter is important in methods and devices for bonding of two substrates (wafers), especially in the critical step of contact-making of the aligned contact surfaces of the two opposite substrates, where the requirement is for more and more exact alignment accuracy or offset of less than 2 μm, especially less than 250 nm, preferably less than 150 nm, more preferably less than 50 nm. To attain these alignment accuracies, many influencing factors must be considered. But the deposition/contact-making of the substrates is especially critical since faults can occur here, and the faults can add up and thus a reproducible alignment accuracy cannot be maintained. This leads to considerable scrap.

The object of this invention is therefore to provide a device and a method for bonding of two substrates, mainly for prebonding or temporary bonding, wherein alignment accuracy as good as possible is achieved everywhere on the wafer, and wherein contamination of the substrate is avoided.

Hereinafter the words "bonding, temporary bonding and prebonding" will be used synonymously. It is clear to one skilled in the art that the invention was developed preferably, but not in a limiting manner, in order to join two wafers to one another by a prebond, as much as possible in a blanketing manner, free of distortions and strain.

For prebonding to produce a temporary or reversible bond between the substrates, there are several methods which are known to one skilled in the art. The prebond thicknesses are below the permanent bond thicknesses, at least by the factor of 2 to 3, especially by the factor 5, preferably by the factor 15, still more preferably by the factor 25. Guideline values are prebond thicknesses of pure, nonactivated, hydrophilized silicon with roughly 100 mJ/m$^2$ and of pure, plasma-activated, hydrophilized silicon with roughly 200-300 mJ/m$^2$. The prebonds between the molecule-wetted substrates arise mainly due to the van-der-Waals interactions between the molecules of the different sides of the wafers.

Bonding means for bonding and/or prebonding and/or temporary bonding are intended for bonding as claimed in the invention.

This object is achieved with the features of the independent Claims. Advantageous developments of the invention are given in the dependent claims. All combinations of at least two of the features given in the specification, the claims and/or the figures also fall within the framework of the invention. At the given value ranges values which lie within the indicated limits are also to be considered disclosed and claimed in any combination.

SUMMARY OF THE INVENTION

The present invention is based on the concept of making contact between the two substrates in a manner, as coordinated and at the same time, as quasi-independently as possible. In accordance with the invention, at least one of the substrates is exposed to pretensioning, which pretensions run radially to the outside, especially concentrically to the middle M of one contact surface of the substrates, before contact-making. Only the beginning of contact-making is influenced. After contact-making of one section, especially of the middle M of the substrates, the substrate is exposed and bonded in a controlled manner to the opposite substrate automatically based on its pretensioning. The pretensioning is achieved by a deformation of the first substrate by deformation means. The deformation means is especially based on their shape acting on the side facing away from the bond side. The deformation is controllable accordingly by using different (especially interchangeable) deformation means. The control also takes place by the pressure or the force with which the deformation means act on the substrate. It is advantageous at this point to reduce the active mounting surface of the mounting apparatus with the semiconductor substrate so that the semiconductor substrate is only partially supported by the mounting apparatus. In this way the smaller contact surface yields a lower adhesion between the wafer and the sample holder or the mounting apparatus. Fixing is established exclusively in the region of the periphery of the semiconductor substrate (first substrate) so that there is effective fixing (attachment) for a mounting surface, which fixing is as small as possible between the mounting contour of the mounting apparatus and the semiconductor substrate. Thus, careful and reliable detachment of the semiconductor substrate is possible since the detachment forces necessary for detaching the wafer are as small as possible.

The mounting contour is the region of the mounting apparatus on which the semiconductor substrate comes to rest. In this respect, for circular semiconductor substrates, the outer periphery of the mounting contour is accordingly circular with analogous dimensions. Conventional outside dimensions are diameters of 200 mm, 300 mm, or 450 mm.

In addition, in the region of the mounting contour beyond the active mounting surface can accommodate elevated structures of the wafer. In this respect, the mounting apparatus is also CMOS-compatible.

Detachment is mainly controllable, especially by reducing the negative pressure on the mounting surface. "Controllable" means that, after the contact of the wafer, with a second wafer the wafer on the sample holder remains fixed, and only by dedicated (controlled) reduction of the negative pressure is removal of the substrate (wafer) from the sample holder (mounting apparatus) effected, especially from the inside to the outside. The embodiment as claimed in the invention leads mainly to the detachment being able to be effected by very small forces.

The substrates (wafers) are aligned relative to one another prior to the bonding process in order to ensure uniform congruence (exact alignment, especially with an accuracy of less than 2 µm, preferably less than 250 nm, still more preferably less than 150 nm, most preferably less than 100 nm) of corresponding structures on their surfaces. In the bonding method according to the invention, the wafers are not placed flat on one another, but are brought into contact with one another first in the middle M by one of the two wafers being pressed lightly against the second wafer or being deformed according in the direction of the opposite wafer. After removing the deformed wafer which is bowed (in the direction of the opposite wafer) by the advance of a bond wave, a continuous and more uniformed bonding along the bond front takes place which is least largely automatic and which is associated with minimal force and thus with minimal, preferably horizontal distortions.

According to one advantageous embodiment of the invention, it is provided that the mounting contour and/or the mounting surface and/or the mounting apparatus is/are made rotationally symmetrical, especially concentric to a center Z of the mounting apparatus. This results in uniform holding and simple production of the mounting apparatus. To the extent the mounting apparatus is made rigid at least on the mounting surface, reliable fixing of the wafer which is accurate in alignment is possible.

By at least one negative pressure channel, which interrupts the mounting surface, being provided in the outer ring section of the mounting contour and the mounting contour being set back in one inner ring section at least largely relative to the mounting surface, there is a geometrical arrangement which is advantageous for the implementation of this invention and with which on the one hand deformation is perfectly executed and on the other hand the contact-making can be carried out in a controlled manner as described above with little effort.

Advantageously the negative pressure channel runs concentrically, especially in the shape of a circular ring, to a center Z of the mounting apparatus, especially around the entire periphery. This ensures uniform fixing.

In another advantageous embodiment of the invention, it is provided that the ring width $b_A$ of the outer, especially circular ring-shaped ring section is smaller than the ring width $b_1$ of the inner ring section. The ratio of the ring width $b_A$ to $b_1$ is especially less than 1 to 3, preferably less than 1 to 5, even more preferably less than 1 to 7. The smaller the ring width $b_A$ relative to the ring width $b_1$, the more easily the semiconductor substrate can be detached from the mounting apparatus.

It is especially advantageous if the projection surface of the mounting contour is at least twice, especially three times, as large as the active mounting surface.

According to another advantageous embodiment of the invention, it is provided that the mounting contour in the inner ring section has at least one, especially circular ring-shaped support surface which is located preferably concentrically to the center Z for supporting, especially without active fixing, of the semiconductor substrates, the support surface being included in the mounting surface and being flush with it. This feature results in further planarization of the mounting apparatus during handling so that the semiconductor substrate does not bow toward the mounting apparatus, or in general, arch.

In another embodiment of the invention, it is provided that the deformation means are made to act on the semiconductor substrate on the side of the mounting surface, especially outside, preferably solely outside the mounting surface. It has been surprisingly shown that by acting on the semiconductor substrate on the side of the mounting surface (generally back of the semiconductor substrate) careful detachment is possible. Moreover contamination of the other surfaces (generally more important because they are for example processed) of the semiconductor substrate is avoided.

To the extent the deformation means is at least one pressure element which penetrates the mounting contour, the pressure can be applied uniformly, especially from the center Z. In this connection a mechanical design, especially by a pin, but also application of a fluid, especially a gas, is possible. For this purpose there is especially an opening, especially a bore, which penetrates the mounting body.

Bonding takes place effectively and with high alignment accuracy due to the smallest possible distortion when the deformation means are made such that the deformation takes place concentrically to the first substrate.

According to another advantageous embodiment, it is provided that in the inner ring section there are especially individually triggerable fixing elements for fixing of the corresponding fixing sections along the first substrate. In this way, distortions and/or strains in the x, y and/or z direction of the first and/or second substrate can be influenced. The distortions and/or strains (which run primarily along the contact surface of the substrates, therefore in the surface) are recorded especially in a prior method step, preferably in the form of stress and/or strain maps of the substrate/substrates and by switching the fixing element when contact is made between the substrates an additional sectional deformation is produced which is made such that especially local distortion/strains are compensated. This is because these distortions/strains more and more strongly influence the alignment accuracy, especially for alignment accuracies less than 250 nm. Fundamentally therefore it is possible to distinguish between horizontal and vertical distortions. The vertical distortions arise due to the evacuation process in the vertical direction, therefore in the z-direction. These distortions however necessarily also result in the horizontal, therefore the x and y distortions, which with respect to the alignment accuracy which is to be achieved constitute the actual problem.

According to the method this is achieved by distortions and/or strains of the first and/or second substrate which have been determined by an upstream measurement method being reduced by action, especially by controlled distortion and/or strain of sections of the first and/or second substrate, on the first and/or second substrate, especially by means of fixing elements for fixing of corresponding fixing sections. The distortions and/or strains can be determined by an external measurement apparatus. The external measurement apparatus is then connected accordingly to the embodiment as claimed in the invention via a data link. Advantageously a measurement apparatus for determining the distortion and/or strain maps would be located in the same module as the claimed embodiment of the invention. Furthermore the possibility of using the same interface for triggering the apparatus for determining the distortion and/or strain maps and of the embodiment as claimed in the invention will be disclosed.

An interface is defined as any type of apparatus of control monitoring. Advantageously it is a computer with corresponding control software and a corresponding graphic user surface.

Features which have been disclosed according to the device will also apply as according to the method and vice versa.

Other advantages, features and details of the invention will become apparent from the following description of preferred exemplary embodiments and using the drawings.

BRIEF DESCRIPTION OF THE DRAWINGS

FIG. 2b shows a view according to cutting line B-B from FIG. 2a, FIG. 3a shows a plan view of a mounting contour of a third embodiment of the device as claimed in the invention with a cutting line C-C, FIG. 4b shows a view according to cutting line D-D from FIG. 4a, FIG. 5a shows a cross sectional view of the first embodiment according to FIG. 1a shortly before detachment, FIG. 5b shows a cross sectional view according to FIG. 5a when the semiconductor substrate is being detached, FIG. 6a shows a schematic of different forms of a pin for detaching the semiconductor substrate, FIG. 7a shows a schematic plan view of a fifth embodiment of the device as claimed in the invention and FIG. 7b shows a cross sectional view of the embodiment according to FIG. 7a.

FIG. 8a shows a cross sectional view of two wafers which are to be bonded to one another before contact-making by a pin, FIG. 8b shows a cross sectional view of two wafers which are to be bonded to one another during contact-making of the upper wafer by a pin, FIG. 8c shows a cross sectional view of two wafers which are to be bonded to one another during elastic bowing of the upper wafer by a pin, FIG. 8d shows a cross sectional view of two wafers which are to be bonded to one another during the first contact between the upper and lower wafer, FIG. 8e shows a cross sectional view of two wafers which are to be bonded to one another during the advancing bond wave between the upper and lower wafer, FIG. 8f shows a cross sectional view of two wafers which are to be bonded to one another in which the upper wafer has already been separated from the sample holder, FIG. 8g shows a cross sectional view of two wafers which are to be bonded to one another, in the bonded state.

DETAILED DESCRIPTION OF THE PREFERRED EMBODIMENT

The same components and components with the same function are identified with the same reference numbers in the figures.

Figure 1A:
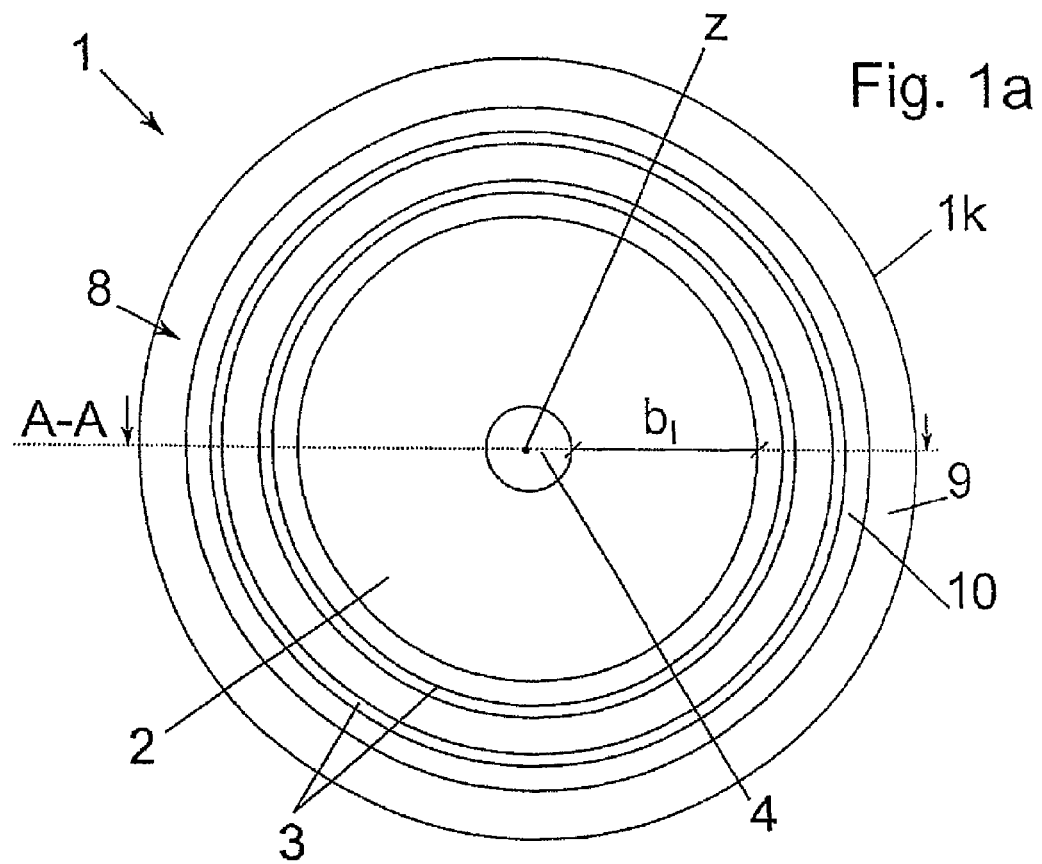
FIG. 1a shows a plan view of a mounting contour of a first embodiment of a device as claimed in the invention with a cutting line A-A.

FIG. 1a shows a mounting apparatus 1 (also called a chuck in the semiconductor industry) of a device for mounting of a first semiconductor substrate 15 (wafer) on a mounting contour 8 of the mounting apparatus 1. The mounting contour 8 has a structure which has a mounting surface 7 in a mounting plane E. Only the mounting surface 7 comes into contact with the semiconductor substrate 15 (when the semiconductor substrate 15 is held on the mounting apparatus 1 (active mounting surface).

Figure 1B:
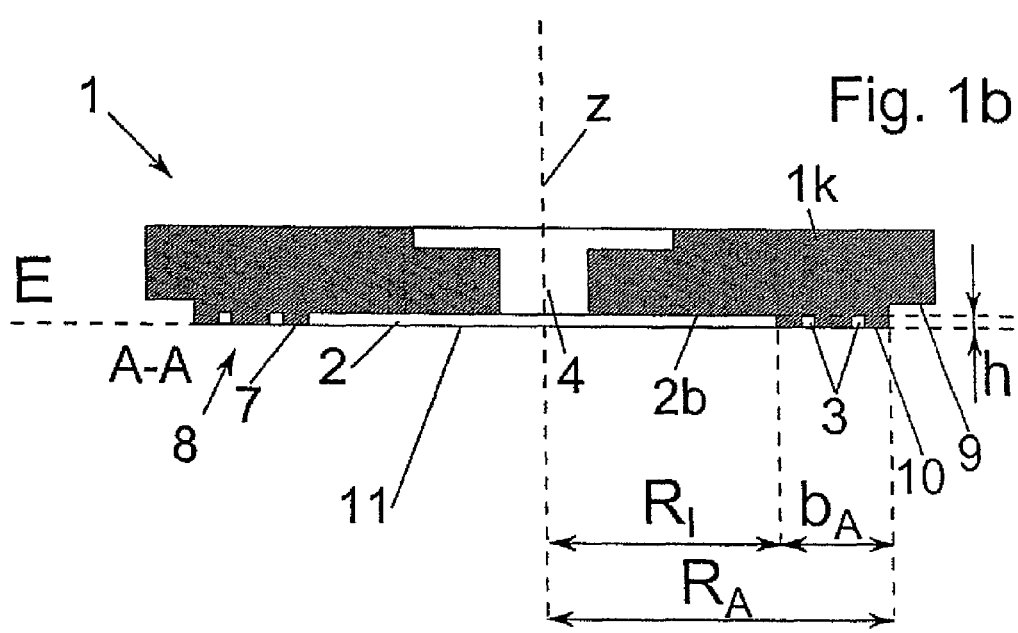
FIG. 1b shows a view according to cutting line A-A from FIG. 1a, FIG. 2a shows a plan view of a mounting contour of a second embodiment of the device as claimed in the invention with a cutting line B-B.

The mounting apparatus 1 is formed from an especially monolithic and/or metallic and/or rigid mounting body 1k; this is especially apparent in the cross sectional view according to FIG. 1b. A coating of the mounting body to prevent scratches or metal ion concentrations is possible. In terms of dimensions, at least the mounting contour 8 of the mounting apparatus 1 is matched to the dimensions of the semiconductor substrate 15 which is to be mounted so that an outer ring radius $R_A$ of the mounting contour 8 corresponds essentially to the radius of the semiconductor substrate 15 which is to be mounted. The diameters of the semiconductor substrates advantageously correspond to the standardized diameters conventional in the industry, 2", 4", 6", 8", 12" and 18" etc., but can also deviate from them if this becomes necessary. The mounting contour 8 and the mounting apparatus 1 are shaped like a circular ring in a plan view, according to the conventional shape of the semiconductor substrates 15. The radius $R_k$ of the mounting body 1k can be greater than the outer ring radius $R_A$ of the mounting contour 8, for the sake of simpler handling. On the periphery of the mounting body 1k as far as the periphery of the mounting contour 8 there can be a shoulder 9 which is set back relative to the mounting plane E in order to facilitate handling of the mounting apparatus 1 (especially in the loading of the semiconductor substrate 15). The periphery of the mounting body 1k and the periphery of the mounting contour 8 are concentric to one center Z of the mounting apparatus 1 or of the mounting contour 8.

From the periphery of the mounting contour 8 (therefore from the outer ring radius $R_A$) an outer ring section 10 of the mounting contour 8 extends to the inner ring radius $R_1$. The outer ring section 10 is designed for fixing of the flat semiconductor substrate 15 by means of negative pressure. The negative pressure is applied by a vacuum apparatus which is not shown to two negative pressure channels 3 which run concentrically to one another. The negative pressure channels 3 run between the outer ring radius $R_A$ and the inner ring radius $R_1$, therefore completely in the ring section 10. The negative pressure channels 3 interrupt the active mounting surface 7. By applying a negative pressure to the negative pressure channels 3, a semiconductor substrate 15 is fixed on the mounting surface 7 in the region of the outer ring section 10 (fixing of the first substrate 15). The negative pressure, and thus the effectively acting fixing force, can preferably be set in a controlled manner (via a corresponding control apparatus for control of the device). Furthermore, the sample holder (mounting apparatus 1) can advantageously be produced such that a closable seal seals the sample holder and maintains the negative pressure without continuous suction from the outside. In this way the sample holder can be removed from any machine, the fixing of the first substrate 15 being maintained at least over a certain time interval.

In the exemplary embodiment according to FIGS. 1a and 1b, the mounting surface 7 corresponds to the surface of the outer ring section 10 in the mounting plane E. Within the outer ring section 10 (therefore in an inner ring section 11) the mounting contour 8 is set back relative to the mounting surface 7 and forms a circular ring-shaped depression 2 whose radius corresponds to the inner ring radius $R_1$. Thus the depression 2 is concentric to the periphery of the mounting contour 8 and concentric to the outer ring section 10. A bottom 2b of the depression 2 runs parallel to the mounting plane E with a distance which corresponds to the height h of the depression 2. The height h of the depression 2 can advantageously correspond to the depth of the negative pressure channels 3 (easier manufacture).

So that a negative pressure does not form in the depression 2 when the semiconductor substrate 15 is mounted, there is an opening 4 which penetrates the mounting body 1k. The opening can be provided as a bore, especially concentric to the center Z or to the periphery of the mounting contour 8.

In the second embodiment according to FIGS. 2a and 2b, the mounting surface 7' consists not only of the outer ring section 10. Rather, the mounting contour 8 (or the mounting body 1k) has a circular ring-shaped support surface 12 which is located concentrically to the center Z and which is formed by a projection 5 provided directly on the opening 4.

Figure 3A:
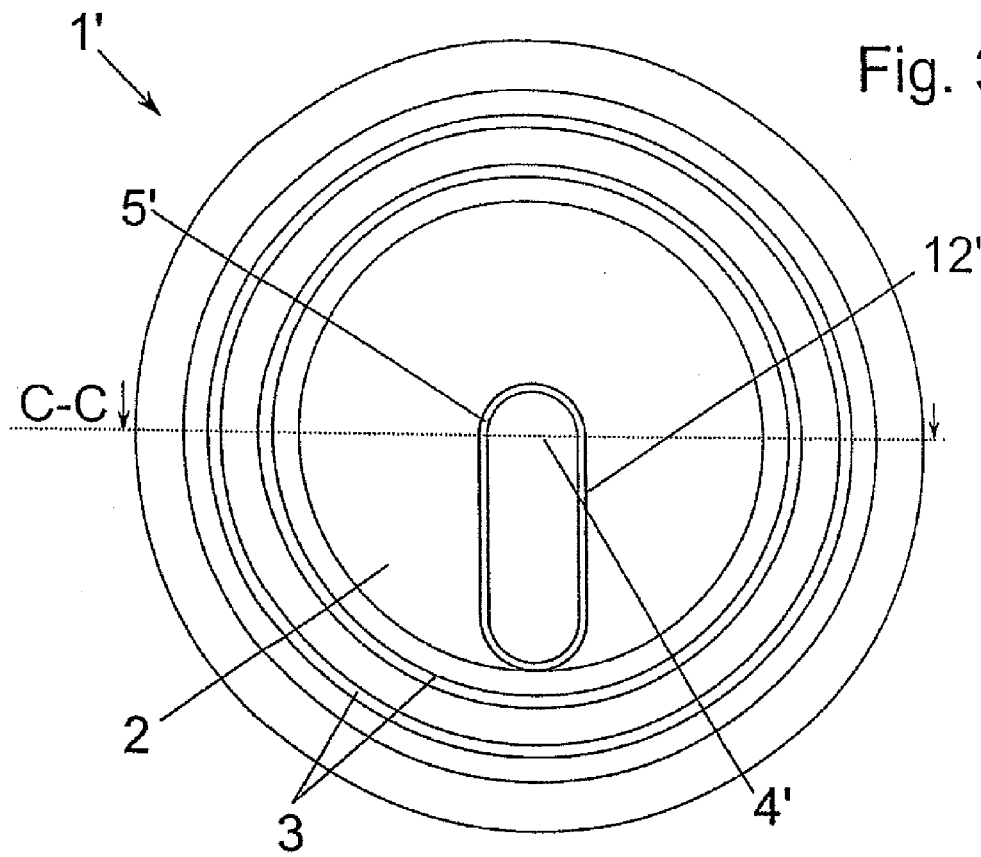
FIG. 3b shows a view according to cutting line C-C from FIG. 3a, FIG. 4a shows a plan view of a mounting contour of a fourth embodiment of the device as claimed in the invention with a cutting line D-D.
Figure 3B:
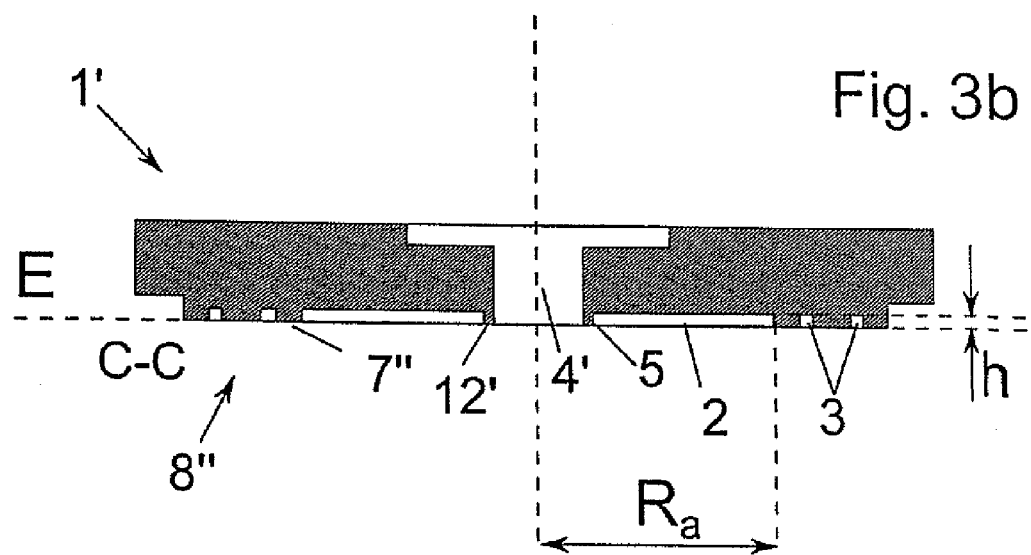

In the third embodiment as shown in FIGS. 3a and 3b, the opening 4' is no longer circular and concentric to the center Z, but slotted. The opening 4' extends from the center Z to the inner ring radius $R_1$. The opening 4' can generally assume any shape which enables the described functionalities. The opening 4', in contrast to the other components, is not rotationally symmetrical to the center Z. Thus the support surface 12' is larger compared to the embodiment as shown in FIGS. 2a and 2b.

In the fourth embodiment as shown in FIGS. 4a and 4b, in addition to the projection 5 there are two further projections 13, 14 which are arranged distributed especially equidistantly to one another concentrically to the first projection 5 in the inner ring section 11. Thus the support surface 12" in the fourth exemplary embodiment is still larger than in the second and third exemplary embodiment so that there is a support surface 12" which is distributed more uniformly in the surface.

In all exemplary embodiments a pin 6 (see FIGS. 5a and 5b) can be routed (i.e., directed) through the opening 4, 4', especially to the inner contour of the opening 4, 4' in order to detach the semiconductor substrate 15 from the mounting surface by acting on the semiconductor substrate 15 on its inner surface 15i with the mounting surface 7, 7', 7", 7"'. The pin 6 is routed preferably without contact to (the inner contour of) the opening 4, 4'. The vacuum paths 3 can be continuously evacuated and flooded, preferably by the control unit of the device.

Instead of the pin 6, pressurization of the depression 2 with a fluid, especially a gas, is conceivable as claimed in the invention; this entails a uniform/homogeneous pressure distribution on the pressurization surface within the depression 2.

The deformation (bowing) of the first substrate 15 is preferably controlled in a monitored manner and is preferably reversible up to complete detachment of the wafer 15 from the sample holder (FIG. 8a-g). Fixing the first substrate 15 in the outer ring section 12 limits the amplitude of the deformation and as claimed in the invention only a slight deformation takes place, especially with an amplitude less than the height h.

The deformation of the first substrate 15 shown in FIG. 5b is used as claimed in the invention for making contact with a second substrate which is aligned to the first substrate 15 before the substrates make contact and which is located opposite. The contact is made by the concentric deformation of the first substrate 15 in the middle M of the substrates.

During action on the inner surface 15i and after the substrates make contact, the negative pressure on the negative pressure channels 3 is reduced, in a controlled manner. Due to the pretensioning induced by means of deformation of the first substrate 15 and/or the acting force of gravity, the first substrate 15 makes contact with the second substrate proceeding from the middle M of the first substrate 15 radially to the outside as far as the periphery of the first substrate 15 and is at least temporarily bonded, a bonding wave advancing more or less concentrically from the middle M of the first substrate 15 as far as its periphery.

Examples of the shapes of the pin 6, 6', 6", 6"' as claimed in the invention are shown in FIG. 6a. The pin 6, 6', 6", 6"' can be matched as claimed in the invention not only to the shape or into the contour of the opening 4, 4', but for example can be made T-shaped in cross section (pin 6') in order to act on the semiconductor substrate 15 with a larger surface and thus to treat it more carefully. The head of the pin 6' can thus be a pressure plate which extends in the depression 2 beyond the inner contour of the opening 4. Furthermore the pin 6, 6', 6", 6"' is spring-loaded according to one advantageous version.

One ring width $b_A$ of the outer ring section 10 is smaller than the inner ring radius $R_1$, especially smaller than a ring width $b_1$ of the inner ring section 11 (see FIGS. 1a, 1b).

Figure 7A:
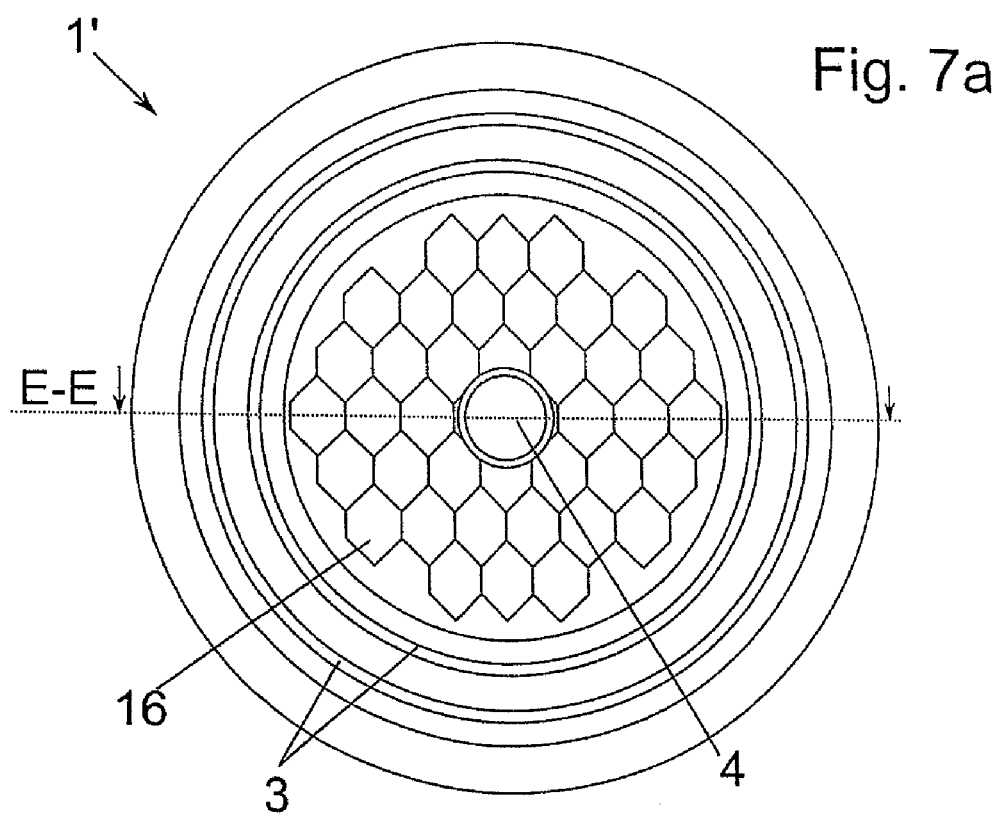
Figure 7B:
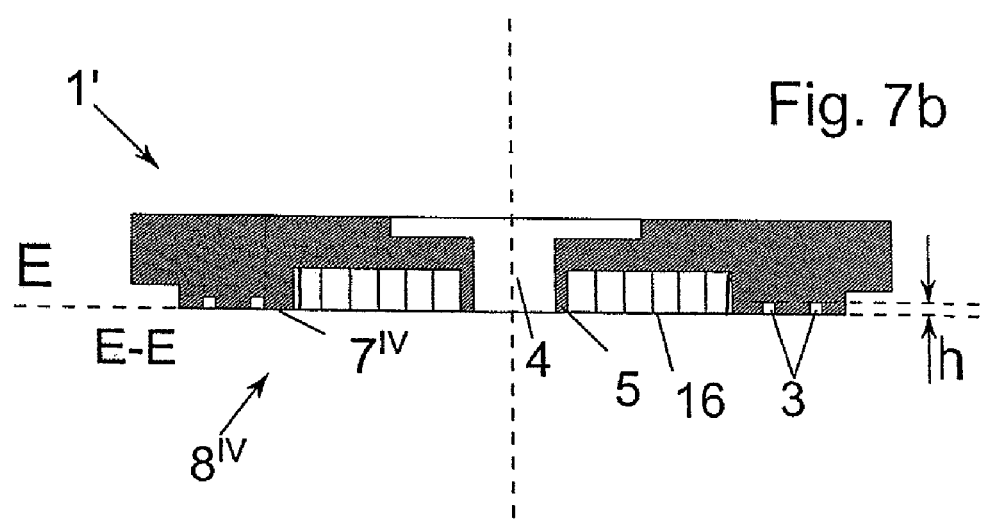

Another embodiment which can be combined with the previous embodiments is shown in FIGS. 7a, 7b. In the region of the depression 2, there are provided honeycomb fixing elements 16 with which corresponding fixing sections of the first substrate 15 can be locally fixed on the mounting apparatus, against the direction of action on the inner surface 15i when the first substrate 15 is deformed. The fixing elements 16 are triggered by the control apparatus. Thus the deformation of the first substrate 15 can be influenced in the direction of the second substrate in a dedicated manner. Using strain/stress maps of the first substrate 15 which is to be bonded, a controlled reduction of the stresses/strains of the first substrate 15 is possible so that the given alignment accuracy of the substrates to one another (or possible structures/elements on the substrates) is not reduced by the existing stress/strains of the substrates or at least of the first substrate 15. Deformation (shearing, compressing, stretching, rotating) of the corresponding fixing sections of the first substrate 15 is possible by controlled triggering of individual fixing elements 16. At alignment accuracies of less than 250 nm, especially less than 150 nm, preferably less than 100 nm which are to be achieved, this plays an increasing larger part since distortions/strains of the substrates can cause local alignment faults of up to 100 nm.

The fixing elements 16 can be electrostatically charged or made as piezoelements.

In this embodiment, a larger effective mounting surface $7^{IV}$ and a mounting contour $8^{IV}$ which is larger compared to the embodiments described above arise so that there is better support of the first substrate 15.

REFERENCE NUMBER LIST 1 mounting apparatus
1k mounting body
2 depression
2b bottom
3 negative pressure channel
4, 4' opening
5, 5' projection 6 pin
7, 7', 7", 7''', 7$^{IV}$ mounting surface
8, 8', 8", 8''', 8$^{IV}$ mounting contour
9 shoulder
10 outer ring section
11 inner ring section
12, 12', 12" support surface
13 projection
14 projection
15 first substrate (semiconductor substrate)
15$i$ inner surface
16 fixing elements
$b_A$ ring width
$b_1$ ring width
$R_k$ radius
$R_A$ outer ring radius
$R_I$ inner ring radius
Z center
E mounting plane
M middle Having described the invention, the following is claimed:

1. A device for temporary bonding of a first substrate with a second substrate comprising:
   a mounting apparatus for mounting of the first substrate on a mounting contour with an active mounting surface of the mounting apparatus, the mounting apparatus comprising:
      a) an outer ring section for controllable fixing of the first substrate, and
      b) an inner ring section positioned inside of an inner edge of the outer edge section, the inner ring section having a recessed surface which is recessed from the mounting surface, said inner ring section further having at least one support surface for supporting the first substrate, the support surface being part of the mounting surface,
   deformation means for controllable deformation of the first substrate, the deformation means being configured to operate in the inner ring section, and
   bonding means for bonding of the first substrate to the second substrate by removal of the deformed first substrate from the mounting apparatus,
   wherein the mounting contour and/or the mounting surface and/or the mounting apparatus is/are made to be symmetrical, about a center Z of the mounting apparatus, and
   wherein, in the inner ring section, there are individually triggerable fixing elements for fixing of corresponding fixing sections along the first substrate.

2. The device as claimed in claim 1, wherein said active mounting surface is comprised of at least one negative pressure channel which interrupts the mounting surface and is provided in the outer ring section of the mounting contour.

3. The device as claimed in claim 2, wherein the negative pressure channel runs concentrically, to the center Z of the mounting apparatus.

4. The device as claimed in claim 2, wherein a ring width $b_A$ of the outer ring section is less than a ring width $b_1$ of the inner ring section.

5. The device as claimed in claim 1, wherein a projection surface of the mounting contour is at least twice as great as the active mounting surface.

6. The device as claimed in claim 1, wherein the support surface is circular ring shaped.

7. The device as claimed in claim 1, wherein the deformation means is further configured to operate on the first substrate mounted to the mounting surface, the deformation means being separate from the mounting surface.

8. The device as claimed in claim 1, wherein the deformation means is at least one pressure element which penetrates the mounting contour.

9. The device as claimed in claim 1, wherein the deformation means is made such that deformation takes place concentrically to the first substrate.

10. A method for temporary bonding of a first substrate to a second substrate comprising the following steps:
   mounting the first substrate to a mounting contour with an active mounting surface of a mounting apparatus, said mounting apparatus comprising:
      a) an outer ring section for controllable fixing of the first substrate, and
      b) an inner ring section positioned inside of an inner edge of the outer edge section, the inner ring section having an area which is recessed from the mounting surface, the mounting contour in the inner ring section having at least one support surface for supporting the first substrate, the support surface being included in the mounting surface,
   deforming a central portion of the first substrate in the inner ring section, and
   bonding the deformed portion of the first substrate to the second substrate by separating the deformed first substrate from the mounting apparatus,
   wherein distortions and/or strains of the first and/or second substrate which have been determined by an upstream measurement method are reduced by controlled distortion and/or strain of sections of the first and/or second substrate, on the first and/or second substrate, by means of fixing elements for fixing of corresponding fixing sections.

11. A method for temporary bonding of a first substrate to a second substrate comprising the following steps:
   mounting the first substrate to a mounting contour with an active mounting surface of a mounting apparatus, said mounting apparatus comprising:
      a) an outer ring section for controllable fixing of the first substrate, and
      b) an inner ring section positioned inside of an inner edge of the outer edge section, the inner ring section having an area which is recessed from the mounting surface, the mounting contour in the inner ring section having at least one support surface for supporting the first substrate, the support surface being included in the mounting surface,
   deforming a central portion of the first substrate in the inner ring section, and
   attaching the deformed portion of the first substrate to the second substrate by bonding means by separating the deformed first substrate from the mounting apparatus,
   wherein the attaching takes place essentially concentrically proceeding from a middle M of contact surface of the first and second substrate by deformation of the first substrate, and
   wherein distortions and/or strains of the first and/or second substrate which have been determined by an upstream measurement method are reduced by controlled distortion and/or strain of sections of the first and/or second substrate, on the first and/or second substrate, by means of fixing elements for fixing of corresponding fixing sections.

12. A device for temporary bonding of a first substrate to a second substrate, said device comprising:

a mounting apparatus for holding said first substrate, said mounting apparatus comprising:
- an outer ring section including a mounting contour having an active mounting surface for securing a periphery of said substrate to said mounting apparatus, and
- inner ring section defining an area recessed from said mounting surface, said inner ring section having at least one support surface for supporting an inner region of said first substrate, said support surface being spaced from said mounting surface, and
- deformation means for controllably deforming a central portion of said first substrate by forcing a central portion of said first substrate away from said mounting apparatus,
- wherein the mounting contour and/or the mounting surface and/or the mounting apparatus is/are made to be symmetrical, about a center axis of the mounting apparatus, and
- wherein, in the inner ring section, there are individually triggerable fixing elements for fixing of corresponding fixing sections along the first substrate.

13. The device as claimed in claim 12, wherein said active mounting surface is comprised of at least one negative pressure channel formed in said mounting surface.

14. The device as claimed in claim 13, wherein said negative pressure channel is symmetrical about said center axis.

* * * * *